United States Patent [19]

Chow et al.

[11] Patent Number: 4,592,070
[45] Date of Patent: May 27, 1986

[54] ADPCM ENCODER/DECODER WITH IMPROVED TRACKING

[75] Inventors: Peter E. Chow, Nepean; Andreas H. Weirich; Leo Strawczynski, both of Ottawa, all of Canada

[73] Assignee: Northern Telecom Limited, Montreal, Canada

[21] Appl. No.: 555,357

[22] Filed: Nov. 28, 1983

[30] Foreign Application Priority Data

Nov. 25, 1983 [CA] Canada ................................. 442021

[51] Int. Cl.⁴ ...................... H03M 3/04; H04B 14/06
[52] U.S. Cl. ...................................... 375/27; 375/30; 332/11 D; 381/31
[58] Field of Search ............................ 375/27, 30, 122; 332/11 D; 381/31

[56] References Cited

U.S. PATENT DOCUMENTS 3,918,042 11/1975 Werner .................................. 375/30
4,319,082 3/1982 Gilloire et al. ........................ 375/30
4,481,619 11/1984 Adoul .................................... 381/31
4,542,516 9/1985 Weirich ................................. 375/30
4,549,304 10/1985 Weirich et al. ....................... 375/27

Primary Examiner—Benedict V. Safourek
Assistant Examiner—Raymond C. Glenny
Attorney, Agent, or Firm—R. John Haley

[57] ABSTRACT

An ADPCM encoder and decoder includes an adaptive quantizer and an adaptive predictor. A quantizing-step-size adaptation circuit determines a quantizing-step-size for the adaptive quantizer in dependence upon the ADPCM signal. When the quantizing-step-size is small, updating of predictor coefficients, produced in the adaptive predictor, in dependence upon a reconstructed signal and a reconstructed error signal derived from the ADPCM signal, is inhibited, the predictor coefficients being updated only in dependence upon a leakage function. This enables improved tracking to be achieved by the ADPCM arrangement.

10 Claims, 2 Drawing Figures

ADPCM ENCODER/DECODER WITH IMPROVED TRACKING

This invention relates to ADPCM (adaptive differential pulse code modulation) encoders and decoders.

CROSS REFERENCES TO RELATED APPLICATIONS

Reference is directed to a related U.S. patent application Ser. No. 555,358, now U.S. Pat. No. 4,542,516 issued Sept. 17, 1985, filed simultaneously herewith by A. Weirich and L. Strawczynski entitled "ADPCM encoder/decoder with zero code suppression", and to a related U.S. patent application Serial No. 555,359, now U.S. Pat. No. 4,549,304 issued Oct. 22, 1985, filed simultaneously herewith by A. Weirich, L. Strawczynski, and E. Munter entitled "ADPCM encoder/decoder with signalling bit insertion". The disclosure of each of these copending applications is hereby incorporated herein by reference.

BACKGROUND OF THE INVENTION

In order to reduce the bandwidth required for digital transmission of voice frequency signals, it is known to convert an 8-bit PCM voice frequency signal to a 4-bit ADPCM signal. Two such ADPCM signals can be transmitted in the same bandwidth as one PCM signal. Furthermore, in many circumstances such ADPCM signals can be transmitted in place of PCM signals over existing transmission links using existing equipment, which is merely supplemented by ADPCM encoders and decoders for converting between PCM and ADPCM signals at the ends of the transmission links.

For conversion from PCM to ADPCM signals without undue signal degradation, it is known to use an encoder which comprises an adaptive predictor and an adaptive quantizer. The quantizer produces the ADPCM signal from the difference between the incoming PCM signal and a predicted signal produced by the adaptive predictor. Adaptation of the quantizer is controlled by the ADPCM signal, which is also supplied to an inverse adaptive quantizer to produce a reconstructed difference signal which controls the adaptive predictor. Similarly, the decoder comprises an inverse adaptive quantizer to produce a reconstructed difference signal from the ADPCM signal, and an adaptive predictor responsive to the reconstructed difference signal for producing a predicted signal, the latter two signals being combined to produce the decoded PCM signal. Ideally, predictor coefficients of the adaptive predictors in the encoder and decoder are identical at all times. Any departure from this is referred to as mistracking.

In practice, mistracking occurs in that, for example, initialization procedures or transmission errors may cause the predictor coefficients in the encoder and the decoder to have different values at the same time. In order to correct such mistracking, it is known to provide a leakage in each predictor coefficient, whereby in the absence of transmission errors the encoder and decoder adaptive predictor functions converge whereby tracking errors are corrected over a period of time. The leakage must be sufficient that this period of time is not too great, but must also be small enough that the prediction function is not altered to such an extent that the signal is noticeably degraded. These conflicting requirements give rise to a problem in determining an appropriate leakage function.

SUMMARY OF THE INVENTION

An object of this invention is to provide an improved ADPCM encoder and decoder and method of ADPCM coding by means of which the above problem is avoided or reduced.

According to one aspect of this invention there is provided an ADPCM decoder comprising: an inverse quantizer for producing a reconstructed error signal from an ADPCM signal; means for producing a reconstructed signal from the reconstructed error signal and a predicted signal; an adaptive predictor for producing the predicted signal from the reconstructed signal and the reconstructed error signal in dependence upon predictor coefficients, the adaptive predictor including means for adapting the predictor coefficients in dependence upon a leakage function and in dependence upon the reconstructed signal and the reconstructed error signal; and means for inhibiting adaptation of the predictor coefficients in dependence upon the reconstructed signal and the reconstructed error signal, when the ADPCM signal has a small magnitude.

Thus in accordance with the invention, updating of the predictor coefficients in dependence upon the reconstructed signal and the reconstructed error signal is inhibited for small ADPCM signal magnitudes, which occur for small signals or for very predictable signals such as sinusoidal signals. In consequence, the leakage function can be reduced, thereby enabling better tracking and an improved decoder performance.

The decoder preferably comprises means for producing an adaptive quantizing-step-size signal from the ADPCM signal, wherein: the inverse quantizer is an inverse adaptive quantizer for producing the reconstructed error signal from the ADPCM signal and the adaptive quantizing-step-size signal; and the means for inhibiting adaptation of the predictor coefficients in dependence upon the reconstructed signal and the reconstructed error signal is responsive to the adaptive quantizing-step-size signal to provide such inhibition when the quantizing-step-size is small.

The invention also extends to an ADPCM encoder comprising an ADPCM decoder as recited above, means for producing an error signal from a signal to be encoded and the predicted signal, and a quantizer for producing the ADPCM signal from the error signal and the adaptive quantizing-step-size signal if the latter signal is produced.

Conveniently the means for producing the reconstructed signal and the means for producing the error signal comprise a single adding means which is multiplexed for producing said signals at different times.

According to another aspect of this invention there is provided a method of decoding an ADPCM signal produced by quantizing an error signal, comprising the steps of: producing a reconstructed error signal from the ADPCM signal; producing a reconstructed signal from the reconstructed error signal and a predicted signal; producing the predicted signal by adaptive prediction from the reconstructed signal and the reconstructed error signal in dependence upon predictor coefficients which are adapted in dependence upon a leakage function and in dependence upon the reconstructed signal and the reconstructed error signal; and inhibiting the adaptation of the predictor coefficients in dependence upon the reconstructed signal and the reconstructed error signal for small magnitudes of the ADPCM signal. Preferably the ADPCM signal is produced by adaptively quantizing the error signal in dependence upon an adaptive quantizing-step-size signal derived from the ADPCM signal; the reconstructed error signal is produced from the ADPCM signal in dependence upon the adaptive quantizing-step-size signal; and the adaptation of the predictor coefficients in dependence upon the reconstructed signal and the reconstructed error signal is inhibited for small quantizing-step-sizes.

The invention further extends to a method of encoding an incoming signal to produce an ADPCM signal, comprising the steps of decoding the ADPCM signal by the method as recited above, producing the error signal from the incoming signal and the predicted signal, and quantizing the error signal, in dependence upon the adaptive quantizing-step-size signal if this is produced, to produce the ADPCM signal.

BRIEF DESCRIPTION OF THE DRAWINGS

The invention will be further understood from the following description with reference to the accompanying drawings, in which.

DESCRIPTION OF THE PREFERRED EMBODIMENT

Figure 1:
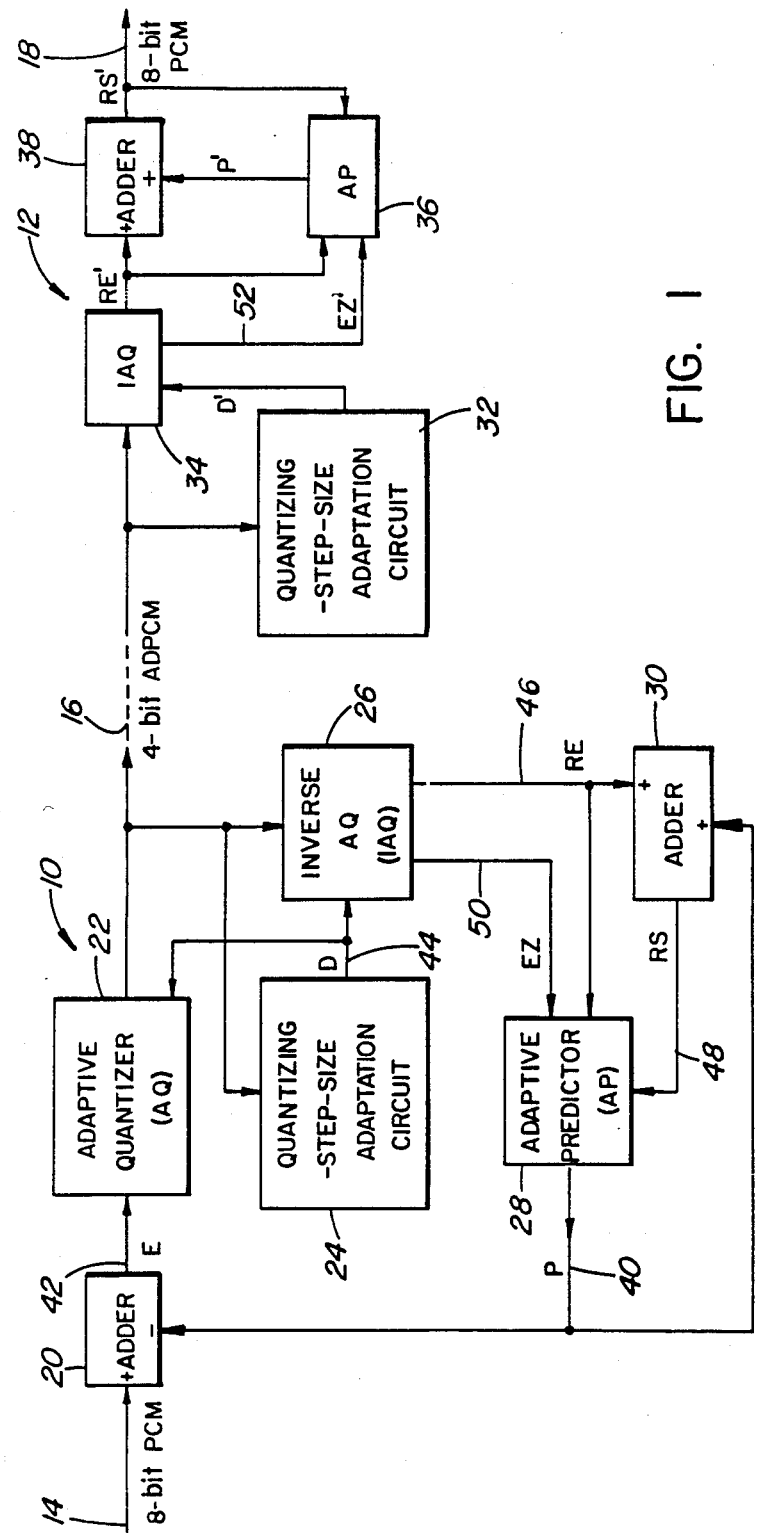
FIG. 1 is a functional block diagram of an ADPCM encoder and decoder in accordance with the invention.

Referring to FIG. 1, there is illustrated a functional block diagram of an ADPCM encoder 10 and decoder 12. The encoder 10 converts an 8-bit PCM signal incoming on a bus 14 to a 4-bit ADPCM signal outgoing on a transmission link 16. The decoder 12 is responsive to the latter signal to reproduce an 8-bit PCM signal on a bus 18.

The functional blocks of the encoder 10 comprise an adder 20, an adaptive quantizer (AQ) 22, a quantizing-step-size adaptation circuit 24, an inverse adaptive quantizer (IAQ) 26, an adaptive predictor (AP) 28, and an adder 30. The functional blocks of the decoder 12 comprise elements 32, 34, 36, and 38 which correspond to, and are interconnected in the same manner as, the elements 24, 26, 28, and 30 respectively of the encoder 10.

In operation, an 8-bit PCM signal sample incoming on the bus 14 has subtracted from it (after linearization as described below with reference to FIG. 2) by the adder 20 an adaptively predicted signal P, produced by the AP 28, on the bus 40, to produce an error signal E on a bus 42. The signal E is quantized by the AQ 22, in dependence upon a quantizing-step-size signal D provided on a bus 44 by the adaptation circuit 24, to produce a 4-bit ADPCM signal sample on the transmission link 16.

The 4-bit ADPCM signal is also supplied to the circuit 24 to control the quantizing-step-size adaptation, and to the IAQ 26 which in dependence upon the step-size signal D produces a reconstructed error signal RE on a bus 46. The signal RE is added to the predicted signal P on the bus 40 by the adder 30 to produce a reconstructed PCM signal sample RS on a bus 48. The AP 28 is responsive to the signals RE and RS to update the predicted signal P.

As is known, the AP 28 produces predictor coefficients which are adapted in dependence upon a leakage function and in dependence upon the reconstructed signal RS and the reconstructed error signal RE. For example, each predictor coefficient is adapted by making its value at any sampling time equal to its value at the preceding sampling time multiplied by a constant less than one (the leakage function), modified by a function of the signal samples RE and RS. If the latter function has a zero value, then it can be seen that, because the leakage function constant is less than one, the predictor coefficient will gradually be reduced to zero.

In a similar manner, in the decoder 12 the 4-bit ADPCM signal is supplied to the circuit 32 to control the decoder quantizing-step-size signal D', which is used by the IAQ 34 to produce from the ADPCM signal a reconstructed error signal RE'. This is added by the adder 38 to a predicted signal P' produced by the AP 36 to produce a reconstructed PCM signal sample RS' which constitutes the output of the decoder, and which is used with the signal RE' to update the predicted signal P'.

The above description briefly describes a known form of ADPCM encoder and decoder. The present invention is directed to an improvement of this, described below.

As illustrated in FIG. 1, in the encoder 10 the IAQ 26 also supplies to the AP 28 a signal EZ via a line 50, and in the decoder 12 the IAQ 34 similarly supplies to the AP 36 a signal EZ' via a line 52. The respective IAQ 26 or 34 produces the signal EZ or EZ' with a predetermined value (e.g. logic 1) in response to the quantizing-step-size signal D or D' being below a predetermined level, as described further below. In response to this value of the signal EZ or EZ', the respective AP 28 or 36 does not adapt its predictor coefficients in dependence upon the signals RE and RS or RE' and RS' respectively, but only in dependence upon the leakage function.

Figure 2:
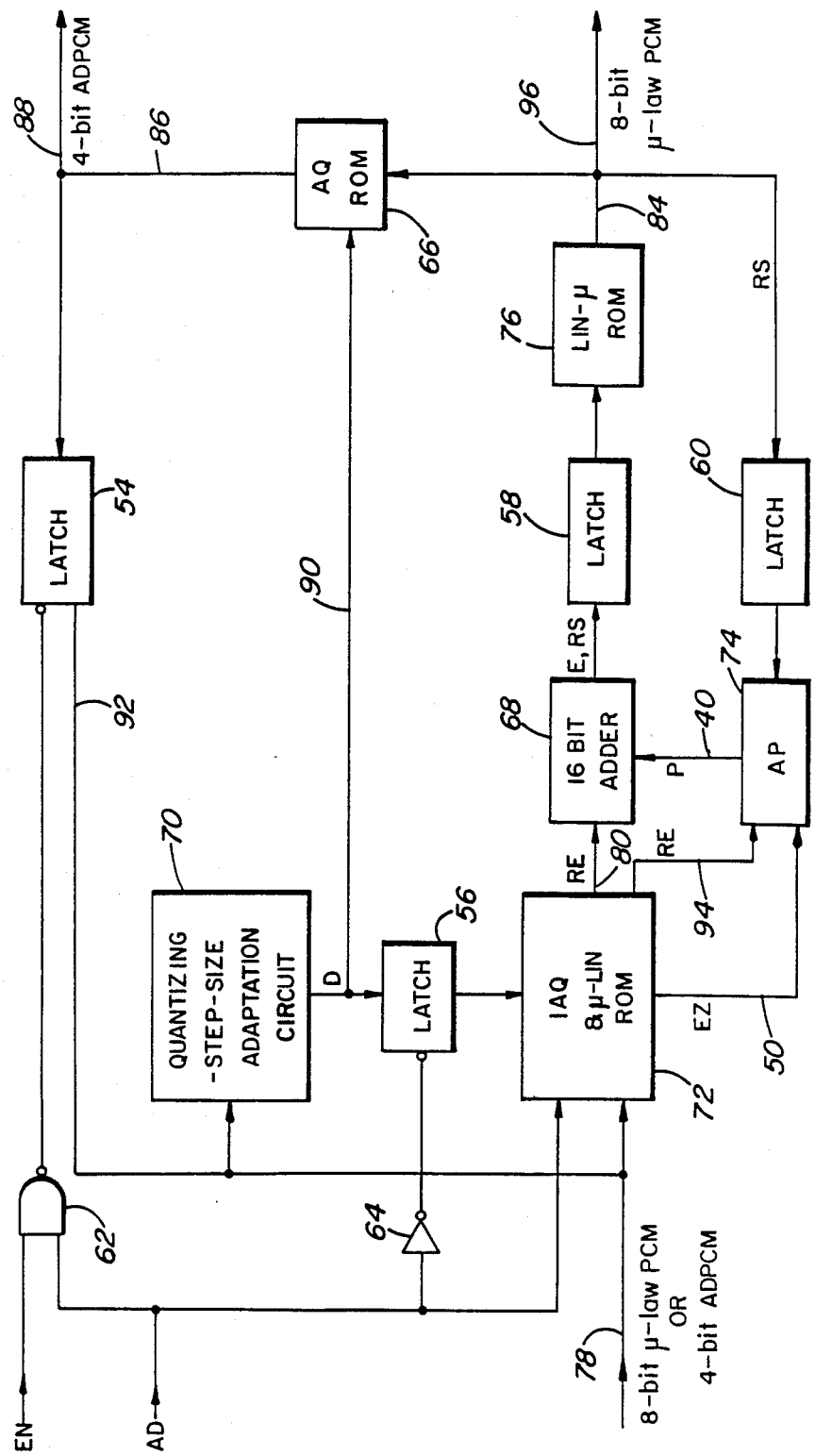
FIG. 2 schematically illustrates the encoder and decoder of FIG. 1 in the form of a block diagram.

FIG. 2 illustrates a block diagram of an encoder and decoder corresponding to the function diagram of FIG. 1. In FIG. 2, latches 54, 56, 58, and 60 are used to enable multiplexing of signals as described below. FIG. 2 also shows a NAND gate 62, an inverter 64, an AQ ROM (read-only memory) 66 which corresponds to the AQ 22 in FIG. 1, a 16-bit adder 68 which corresponds to the adders 20, 30, and 38 in FIG. 1, a quantizing-step-size adaptation circuit 70 which corresponds to the circuits 24 and 32 in FIG. 1, an IAQ and mu-law to linear PCM conversion ROM 72 which replaces the IAQs 26 and 34 in FIG. 1, an AP 74 which corresponds to the APs 28 and 36 in FIG. 1, and a linear to mu-law PCM conversion ROM 74. Signals EN and AD are supplied to the gate 62 whose output enables the latch 54, the signal AD also being supplied to the ROM 72 and being inverted by the inverter 64 to enable the latch 56.

In operation, the arrangement of FIG. 2 is controlled by the signals EN and AD to operate alternately as a mu-law PCM to ADPCM encoder and decoder. For operation as an encoder, in a first part of the encoding cycle the signal AD is a logic 0 so that the latch 54 is inhibited via the gate 62, the latch 56 is inhibited via the inverter 64, and the ROM 72 is controlled to convert an 8-bit mu-law PCM code word incoming on a bus 78 into a negative (two's complement) 15-bit linear PCM code word on a bus 80. The negative linear PCM code word on the bus 80 is added by the adder 68 to the relevant predicted signal P produced by the AP 74 on the bus 40, to produce a negative error signal E which is latched in the latch 58.

In a second part of the encoding cycle, the signals EN and AD are each a logic 1, so that the latches 54 and 56 are enabled. The negative linear error signal E from the latch 58 is converted by the ROM 76 into an 8-bit mu-law PCM negative error signal code word on a bus 84, which is quantized by the AQ ROM 66 into a 4-bit ADPCM code word on a bus 86, the quantization being dependent on the quantizing-step-size signal D which is supplied on a bus 90 to the AQ ROM 66 and is also latched in the latch 56. The ADPCM code word on the bus 86 constitutes the output of the encoder on a bus 88 corresponding to the transmission link 16 in FIG. 1, and is also latched in the latch 54.

The output of the latch 54 is supplied via a bus 92 to the circuit 70, which adapts the quantizing-step-size signal D accordingly, and to the ROM 72. The signal AD=1 causes the ROM 72 to operate as an inverse adaptive quantizer and mu-law to linear converter, responsive to the quantizing-step-size signal latched in the latch 56 to produce a linear reconstructed error signal RE on the bus 80. The signal RE is added to the linear predicted signal P on the bus 40 by the adder 68 to produce a linear reconstructed signal RS which is latched in the latch 58. The signal RS is converted by the ROM 76 into a mu-law signal which is latched from the bus 84 into the latch 60.

The reconstructed signal RS from the latch 60, and a mu-law version of the reconstructed error signal RE supplied by the IAQ ROM 72 on a bus 94, are applied to the AP 74. The AP 74 adapts its predictor coefficients in dependence upon the leakage function and these signals if the signal EZ, supplied from the ROM 72 to the AP 74 via the line 50, does not have the predetermined value, e.g. logic 1. If the signal EZ has the predetermined value such adaptation of the predictor coefficients by the AP 74 in dependence upon the signals RE and RS is inhibited, and the predictor coefficients are changed only by the leakage function included in the characteristics of the AP 74.

For operation as a decoder, the signals EN and AD are a logic 0 and 1 respectively, so that the latch 54 is inhibited and the latch 56 is enabled. A 4-bit ADPCM signal to be decoded is in this case supplied to the ROM 72 via the bus 78, and the consequent reconstructed signal is derived from the ROM 76 via the bus 84 and a bus 96 corresponding to the bus 18 in FIG. 1. Otherwise the operation of the arrangement is the same as that described above for the second part of the encoding cycle.

By way of example, it is observed that the quantizing-step-size signal D can be a 5-bit digital signal providing 32 different quantizing-step-sizes. In this case, the IAQ ROM 72 is conveniently arranged to produce the signal EZ with the predetermined value, e.g. EZ=1, to inhibit updating of the predictor coefficients in dependence upon the signals RE and RS, when the quantizing step-size signal D has one of its lowest 4 magnitudes.

Although a particular embodiment of the invention has been described in detail, it should be understood that numerous modifications, variations, and adaptations may be made thereto without departing from the scope of the invention, which is defined by the claims. In particular, it is observed that the zero code suppression and signalling bit insertion techniques, described in the copending patent applications filed simultaneously herewith and already referred to, can be incorporated in the arrangement described herein. In this respect the signal EZ of the former technique can be OR-ed in the ROM 72 with the signal EZ described above, to provide a single, composite signal EZ on the line 50. It is also observed that although reference has been made to mu-law PCM signals being converted into ADPCM signals, the invention is equally applicable to other signals, including A-law and linear PCM signals.

What is claimed is:

1. An ADPCM decoder comprising:
   an inverse quantizer for producing a reconstructed error signal from an ADPCM signal;
   means for producing a reconstructed signal from the reconstructed error signal and a predicted signal;
   an adaptive predictor for producing the predicted signal from the reconstructed signal and the reconstructed error signal in dependence upon predictor coefficients, the adaptive predictor including means for adapting the predictor coefficients in dependence upon a leakage function and in dependence upon the reconstructed signal and the reconstructed error signal; and
   means for inhibiting adaptation of the predictor coefficients in dependence upon the reconstructed signal and the reconstructed error signal when the ADPCM signal has a small magnitude.

2. A decoder as claimed in claim 1 and comprising means for producing an adaptive quantizing-step-size signal from the ADPCM signal, wherein:
   the inverse quantizer is an inverse adaptive quantizer for producing the reconstructed error signal from the ADPCM signal and the adaptive quantizing-step-size signal; and
   the means for inhibiting adaptation of the predictor coefficients in dependence upon the reconstructed signal and the reconstructed error signal is responsive to the adaptive quantizing-step-size signal to provide such inhibition when the quantizing-step-size is small.

3. An ADPCM encoder comprising:
   an ADPCM decoder as claimed in claim 2;
   means for producing an error signal from a signal to be encoded and the predicted signal; and
   an adaptive quantizer for producing the ADPCM signal from the error signal and the adaptive quantizing-step-size signal.

4. An encoder as claimed in claim 3 wherein the means for producing the reconstructed signal and the means for producing the error signal comprise a single adding means which is multiplexed for producing said signals at different times.

5. An ADPCM encoder comprising:
   an ADPCM decoder as claimed in claim 1;
   means for producing an error signal from a signal to be encoded and the predicted signal; and
   a quantizer for producing the ADPCM signal from the error signal.

6. An encoder as claimed in claim 5 wherein the means for producing the reconstructed signal and the means for producing the error signal comprise a single adding means which is multiplexed for producing said signals at different times.

7. A method of decoding an ADPCM signal produced by quantizing an error signal, comprising the steps of:
   producing a reconstructed error signal from the ADPCM signal;
   producing a reconstructed signal from the reconstructed error signal and a predicted signal;

producing the predicted signal by adaptive prediction from the reconstructed signal and the reconstructed error signal in dependence upon predictor coefficients which are adapted in dependence upon a leakage function and in dependence upon the reconstructed signal and the reconstructed error signal; and inhibiting the adaptation of the predictor coefficients in dependence upon the reconstructed signal and the reconstructed error signal for small magnitudes of the ADPCM signal.

8. A method as claimed in claim 7 wherein the ADPCM signal is produced by adaptively quantizing the error signal in dependence upon an adaptive quantizing-step-size signal derived from the ADPCM signal; the reconstructed error signal is produced by the ADPCM signal in dependence upon the adaptive quantizing-step-size signal; and the adaptation of the predictor coefficients, in dependence upon the reconstructed signal and the reconstructed error signal, is inhibited for small quantizing-step-sizes.

9. A method of encoding an incoming signal to produce an ADPCM signal, comprising the steps of:
  decoding the ADPCM signal by the method as claimed in claim 8;
  producing the error signal from the incoming signal and the predicted signal; and
  adaptively quantizing the error signal in dependence upon the adaptive quantizing-step-size signal to produce the ADPCM signal.

10. A method of encoding an incoming signal to produce an ADPCM signal, comprising the steps of:
  decoding the ADPCM signal by the method as claimed in claim 7;
  producing the error signal from the incoming signal and the predicted signal; and
  quantizing the error signal to produce the ADPCM signal.

* * * * *